(12) United States Patent
Hayashi et al.

(10) Patent No.: US 9,754,816 B2
(45) Date of Patent: Sep. 5, 2017

(54) SEMICONDUCTOR DEVICE AND METHOD OF MANUFACTURING SEMICONDUCTOR DEVICE

(71) Applicant: Renesas Electronics Corporation, Tokyo (JP)

(72) Inventors: Yoshihiro Hayashi, Tokyo (JP); Naoya Inoue, Tokyo (JP); Kishou Kaneko, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 15/087,427

(22) Filed: Mar. 31, 2016

(65) Prior Publication Data
US 2016/0211173 A1    Jul. 21, 2016

Related U.S. Application Data

(63) Continuation of application No. 14/744,261, filed on Jun. 19, 2015, now Pat. No. 9,312,394, which is a (Continued)

(30) Foreign Application Priority Data

Dec. 15, 2008 (JP) .................................. 2008-318098

(51) Int. Cl.
*H01L 21/44* (2006.01)
*H01L 21/768* (2006.01)
(Continued)

(52) U.S. Cl.
CPC .. *H01L 21/76807* (2013.01); *H01L 21/28282* (2013.01); *H01L 21/76877* (2013.01);
(Continued)

(58) Field of Classification Search
CPC ......... H01L 21/76807; H01L 21/76877; H01L 29/66969; H01L 29/66757
(Continued)

(56) References Cited

U.S. PATENT DOCUMENTS 5,112,765 A    5/1992 Cederbaum et al.
5,341,327 A    8/1994 Kuriyama
(Continued)

FOREIGN PATENT DOCUMENTS

JP    5-13718 A    1/1993
JP    H 5-55528 A    3/1993
(Continued)

OTHER PUBLICATIONS

United States Office Action dated Jul. 16, 2014 in co-pending U.S. Appl. No. 13/745,291.
(Continued)

*Primary Examiner* — Long K Tran
(74) *Attorney, Agent, or Firm* — McGinn IP Law Group, PLLC

(57) ABSTRACT

The method of manufacturing a semiconductor device, including preparing a semiconductor substrate, forming a first insulating layer over said semiconductor substrate, forming first grooves in the first insulating film, forming a gate electrode and a first interconnect in the first grooves, respectively, forming a gate insulating film over the gate electrode, forming a semiconductor layer over the gate insulating, forming a second insulating layer over the semiconductor layer and the first insulating film, forming a via in the second insulating layer, and forming a second interconnect such that the second interconnect is connected to the semiconductor layer through the via. The gate electrode, the first interconnect and the second interconnect are formed by Cu or Cu alloy, respectively.

20 Claims, 8 Drawing Sheets

Related U.S. Application Data continuation of application No. 13/745,291, filed on Jan. 18, 2013, now Pat. No. 9,129,937, which is a continuation of application No. 12/654,205, filed on Dec. 14, 2009, now Pat. No. 8,378,341.

(51) Int. Cl.

| H01L 21/28 | (2006.01) |
|---|---|
| H01L 27/12 | (2006.01) |
| H01L 29/423 | (2006.01) |
| H01L 29/792 | (2006.01) |
| H01L 29/41 | (2006.01) |
| H01L 29/49 | (2006.01) |
| H01L 29/51 | (2006.01) |
| H01L 29/786 | (2006.01) |
| H01L 29/66 | (2006.01) |
| H01L 29/24 | (2006.01) |

(52) U.S. Cl.
CPC ........ *H01L 27/124* (2013.01); *H01L 27/1225* (2013.01); *H01L 29/24* (2013.01); *H01L 29/41* (2013.01); *H01L 29/42344* (2013.01); *H01L 29/42352* (2013.01); *H01L 29/495* (2013.01); *H01L 29/4908* (2013.01); *H01L 29/4966* (2013.01); *H01L 29/518* (2013.01); *H01L 29/66757* (2013.01); *H01L 29/66969* (2013.01); *H01L 29/7869* (2013.01); *H01L 29/78648* (2013.01); *H01L 29/792* (2013.01); *H01L 29/242* (2013.01)

(58) Field of Classification Search
USPC ............... 438/75, 85, 86, 104, 754, 687
See application file for complete search history.

(56) References Cited

U.S. PATENT DOCUMENTS

| 5,728,604 | A | 3/1998 | Rha et al. |
|---|---|---|---|
| 6,153,458 | A | 11/2000 | Zamanian et al. |
| 6,525,379 | B2 | 2/2003 | Nomoto et al. |
| 6,879,359 | B1 | 4/2005 | Kikkawa et al. |
| 7,046,321 | B2 | 5/2006 | Kikkawa et al. |
| 7,795,619 | B2 | 9/2010 | Hara |
| 8,003,981 | B2 | 8/2011 | Iwasaki et al. |
| 2003/0127680 | A1 | 7/2003 | Nomoto et al. |
| 2005/0159012 | A1 | 7/2005 | Ohto et al. |
| 2006/0019493 | A1* | 1/2006 | Li .................... H01L 21/76823 438/680 |
| 2006/0043485 | A1 | 3/2006 | Fukushima et al. |
| 2006/0186441 | A1 | 8/2006 | Takayama et al. |
| 2006/0278873 | A1 | 12/2006 | Ishii |
| 2007/0257261 | A1 | 11/2007 | Hirai et al. |
| 2007/0278694 | A1 | 12/2007 | Kobayashi |
| 2008/0073711 | A1 | 3/2008 | Murata et al. |
| 2008/0122098 | A1 | 5/2008 | Kajimoto et al. |
| 2008/0184543 | A1 | 8/2008 | Sako et al. |
| 2009/0185257 | A1* | 7/2009 | Maeda ............... G02B 26/0833 359/290 |
| 2010/0038619 | A1 | 2/2010 | Tada et al. |
| 2010/0065115 | A1* | 3/2010 | Yata .................. H01L 31/02242 136/256 |
| 2010/0129190 | A1* | 5/2010 | Gromadzki ............. B65H 3/06 414/802 |
| 2010/0163862 | A1 | 7/2010 | Yang et al. |
| 2011/0256684 | A1 | 10/2011 | Iwasaki et al. |

FOREIGN PATENT DOCUMENTS

| JP | H 6-13576 A | 1/1994 |
|---|---|---|
| JP | H 7-66427 | 3/1995 |
| JP | H 10-200125 A | 7/1998 |
| JP | 2000-147493 A | 5/2000 |
| JP | 2001-274409 A | 10/2001 |
| JP | 2001-284449 A | 10/2001 |
| JP | 2002-50704 A | 2/2002 |
| JP | 2002-353167 A | 12/2002 |
| JP | 2005-166757 A | 6/2005 |
| JP | 2006-210828 A | 8/2006 |
| JP | 2007/250983 A | 9/2007 |
| JP | 2008-192739 A | 8/2008 |
| JP | 2008-283013 A | 11/2008 |

OTHER PUBLICATIONS

United States Notice of Allowance dated Dec. 8, 2014 in co-pending U.S. Appl. No. 13/745,291.
United States Notice of Allowance dated Oct. 17, 2012 in co-pending U.S. Appl. No. 12/654,205, now U.S. Pat. No. 8,378,341.
United States Office Action dated Jun. 7, 2012 in co-pending U.S. Appl. No. 12/654,205, now U.S. Pat. No. 8,378,341.
United States Notice of Allowance dated Dec. 7, 2011 in co-pending U.S. Appl. No. 12/654,205, now U.S. Pat. No. 8,378,341.
Japanese Notification of Reasons for Refusal dated Sep. 10, 2012, with English-Language translation.
Gang Xiong, et al. "Control of p- and n-type conductivity in sputter deposition of undoped ZnO", 2002, American Institute of Physics, Applied Physics Letters, vol. 80, No. 7, Feb. 18, 2002.
Minkyu Kim, et al. "High mobility bottom gate in GaZnO thin film transistors with SiOx etch stopper", 2007, American Institute of Physics, Applied Physics Letters 90, 212114(2007).
Hisato Yabuta, et al., "High-mobility thin-film transistor with amorphous InGaZn04 channel fabricated by room temperature rf-magentron sputtering", 2006 American Institute of Physics, Applied Physics Letters 89, 112 123 (2006).
Chang Jun9 Kim, et al., Highly stable Ga2-03-In203—Zn0 TFT for active-matrix organic light-emitting diode display application, IEEE Electron Devices Meeting, IEDM '06, Technical Digest, session 11.6, 2006.
M. Ofuji, et al. "Integrated circuits based on amorphous indium-gallium-zing-oxide-channel thin-film transistors", ECS Transactions, 3(8) 293-300 (2006).
Elvira M.C. Fortunato, et al. "Wide-bandgap high-mobility ZnO thin-film transistors produced at room temperature", 2004 American Institute of Physics, Applied Physics Letters, vol. 85, No. 13, Sep. 27, 2004.
Japanese Notice of reasons for Regection dated Sep. 1, 2012, with English-Language translation.
Japanese Notice of reasons for Rejection dated Aug. 13, 2013, with English-Language translation.
Japanese Office Action dated Mar. 3, 2015 with and English Translation thereof.
Japanese Office Action dated May 26, 2015 with partial English Translation.
United States Notice of Allowance dated Dec. 10, 2015 in co-pending U.S. Appl. No. 14/744,261.
Japanese Office Action dated Aug. 25, 2015 with a partial English translation thereof.

* cited by examiner

SEMICONDUCTOR DEVICE AND METHOD OF MANUFACTURING SEMICONDUCTOR DEVICE

The present application is a Continuation Application of U.S. patent application Ser. No. 14/744,261, filed on Jun. 19, 2015 which is a Continuation of U.S. patent application Ser. No. 13/745,291, filed on Jan. 18, 2013, now U.S. Pat. No. 9,129,937 B2, which is a Continuation Application of U.S. patent application Ser. No. 12/654,205, now U.S. Pat. No. 8,378,341, filed on Dec. 14, 2009, which is based on Japanese Patent Application No. 2008-318098 filed on Dec. 15, 2008, the entire contents of which are hereby incorporated by reference.

BACKGROUND

Technical Field

The present invention relates to a semiconductor device and a method of manufacturing a semiconductor device.

Related Art

General semiconductor device is configured to have semiconductor elements such as transistors formed on a semiconductor substrate, and to have a plurality of interconnect layer formed over the transistors. In the semiconductor device thus configured, a layout of the semiconductor elements formed on the semiconductor substrate is determined based on functions required for the semiconductor device.

In recent years, investigations have been made on forming thin-film transistors using compound semiconductor layers, as described in the literatures (1) to (6):

(1) "Control of p- and n-type conductivity in sputter deposition of undoped ZnO", Gang Xiong, et al., App. Phys. Lett., Vol. 80, No. 7, 18 Feb. 2002;

(2) "High mobility bottom gate InGaZnO thin film transistors with SiOx etch stopper", Minlyu Kim, et al., App. Phys. Lett., Vol. 90, 212114 (2007);

(3) "High mobility thin-film transistors with InGaZnO channel fabricated by room temperature rf-magnetron sputtering", Hisato Yabuta, et al., App. Phys. Lett., Vol. 89, 112123 (2006);

(4) "Highly Stable $Ga_2O_3$—$In_2O_3$—ZnO TFT for Active-Matrix Organic Light-Emitting Diode Display Application", Chang Jung Kim, et al., IEEE Electron Devices Meeting, IEDM '06, Technical Digest, session 11.6, 2006;

(5) "Integrated circuits based on amorphous indium-gallium-zinc-oxide-channel thin-film transistors", M. Ofuji, et al., ECS Transactions, 3 (8), 293-300 (2006); and (6) "Wide-bandgap high-mobility ZnO thin-film transistors produced at room temperature", Elvira M. C. Fortunato, et al., App. Phys. Lett., Vol. 85, No. 13, 27 Sep., 2004.

If the functions of the semiconductor device may be modified while leaving the layout of the semiconductor elements formed on the semiconductor substrate unchanged, now a plurality of types of semiconductor devices having different functions may be manufactured using the same semiconductor substrate. In this case, costs for manufacturing the semiconductor device may be saved. On the other hand, the interconnect layers over the semiconductor substrate have included only interconnects, capacitor elements, fuses and so forth, so that functions of the semiconductor device have been changeable only to a limited degree, simply by modifying configuration of the interconnect layer. It is, therefore, expected to largely modify the functions of the semiconductor devices without changing the layout of the semiconductor elements formed on the semiconductor substrate, if any element having new function may be formed in the interconnect layer.

SUMMARY

In one embodiment, there is provided a semiconductor device which includes:

a semiconductor substrate;

a first interconnect layer which includes an insulating layer formed over the semiconductor substrate, and a first interconnect filled in a surficial portion of the insulating layer;

a semiconductor layer positioned over the first interconnect layer;

a gate insulating film positioned over or below the semiconductor layer; and a gate electrode positioned on the opposite side of said semiconductor layer while placing the gate insulating film in between.

According to the present invention, an element which has a semiconductor layer, a gate insulating film, and a gate electrode is provided in the interconnect layer. The element functions typically as a transistor (switching element) or a memory element. Accordingly, an element having a new function may be provided to the interconnect layer, and thereby the functions of the semiconductor device may be modified to a large degree, without changing the layout of the semiconductor elements formed on the semiconductor substrate.

In another embodiment, there is provided also a method of manufacturing a semiconductor device which includes:

forming, over a semiconductor substrate, a first interconnect layer which includes an insulating layer, and a first interconnect filled in a surficial portion of the insulating layer;

forming, over the first interconnect layer, a gate insulating film which is positioned over the first interconnect;

forming a semiconductor layer over the gate insulating film; and forming source-and-drain regions in the semiconductor layer.

In another embodiment, there is provided still also a method of manufacturing a semiconductor device which includes:

forming, over a semiconductor substrate, a first interconnect layer which includes an insulating layer, and a first interconnect filled in a surficial portion of the insulating layer;

forming a semiconductor layer over the first interconnect layer;

forming a gate insulating film over the semiconductor layer;

forming a gate electrode over the gate insulating film; and forming source-and-drain regions in the semiconductor layer.

According to the present invention, an element having a new function may be provided to the interconnect layer, and thereby the functions of the semiconductor device may be modified to a large degree, without changing the layout of the semiconductor elements formed on the semiconductor substrate.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
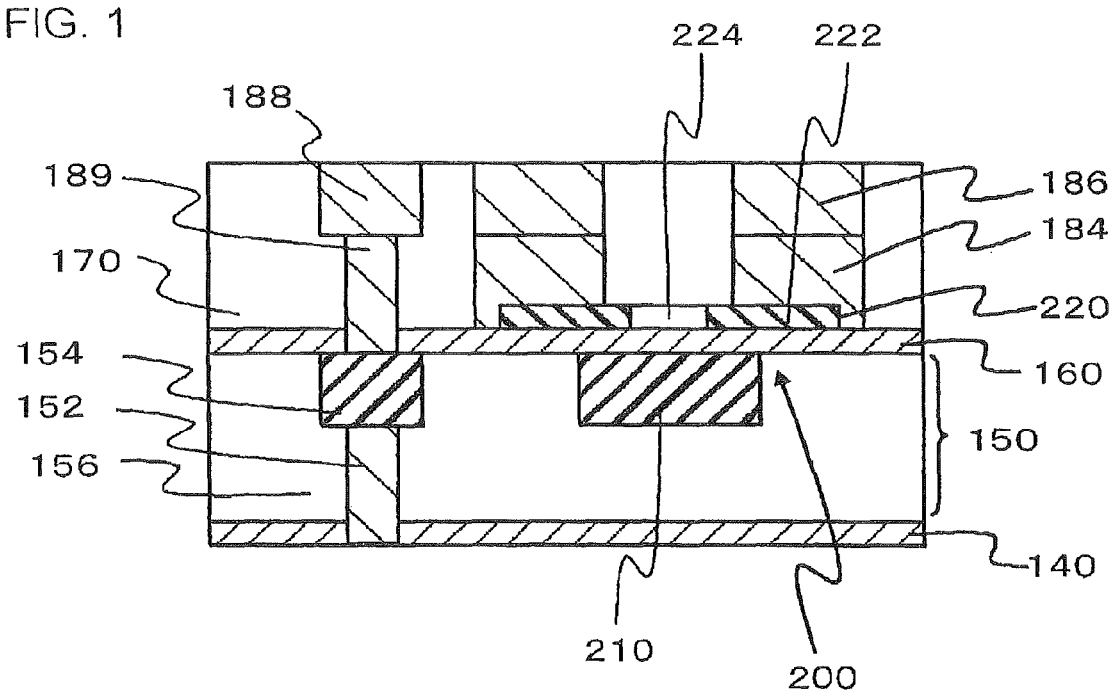
FIG. 1 is a sectional view illustrating an exemplary configuration of an essential portion of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given with the same reference numerals or symbols in all drawings, and explanations therefor will not be repeated.

Figure 2:
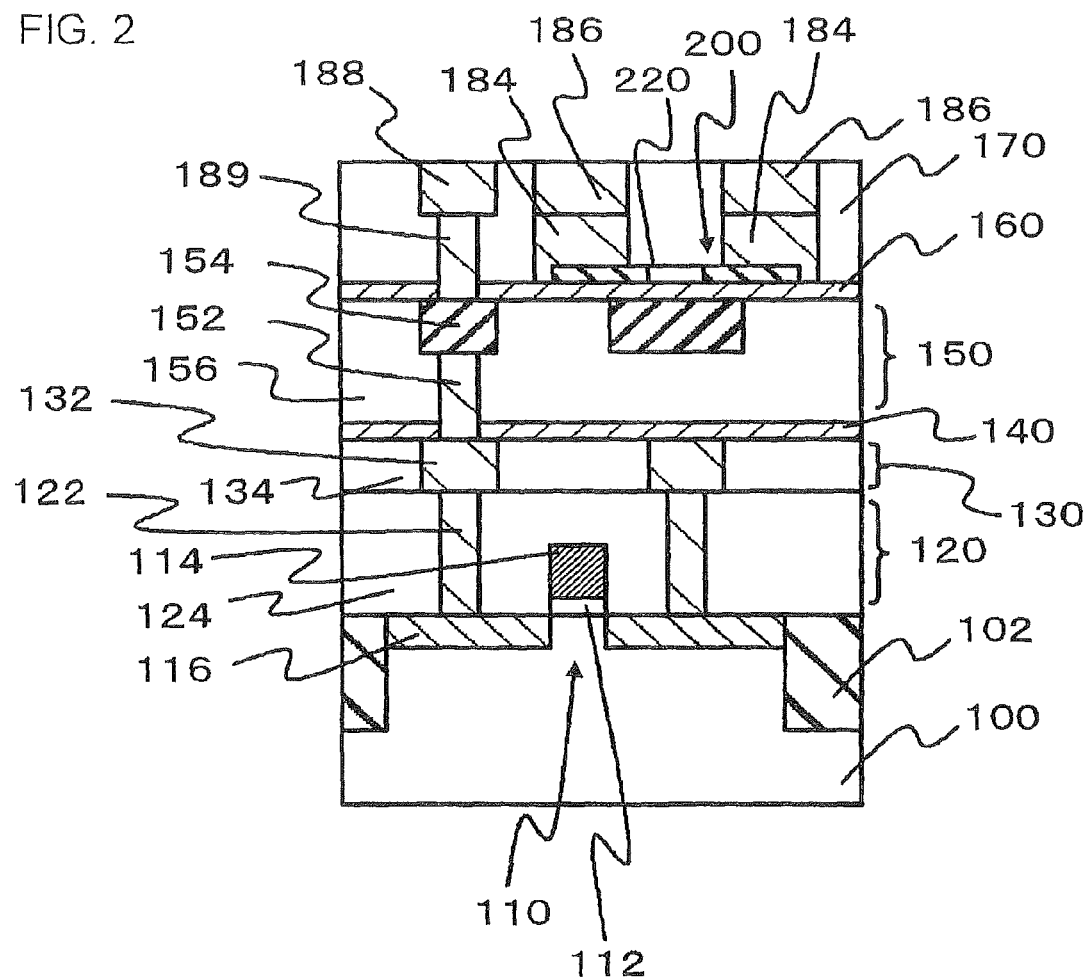
FIG. 2 is a sectional view illustrating an exemplary configuration of the semiconductor device of the first embodiment.
Figure 3:
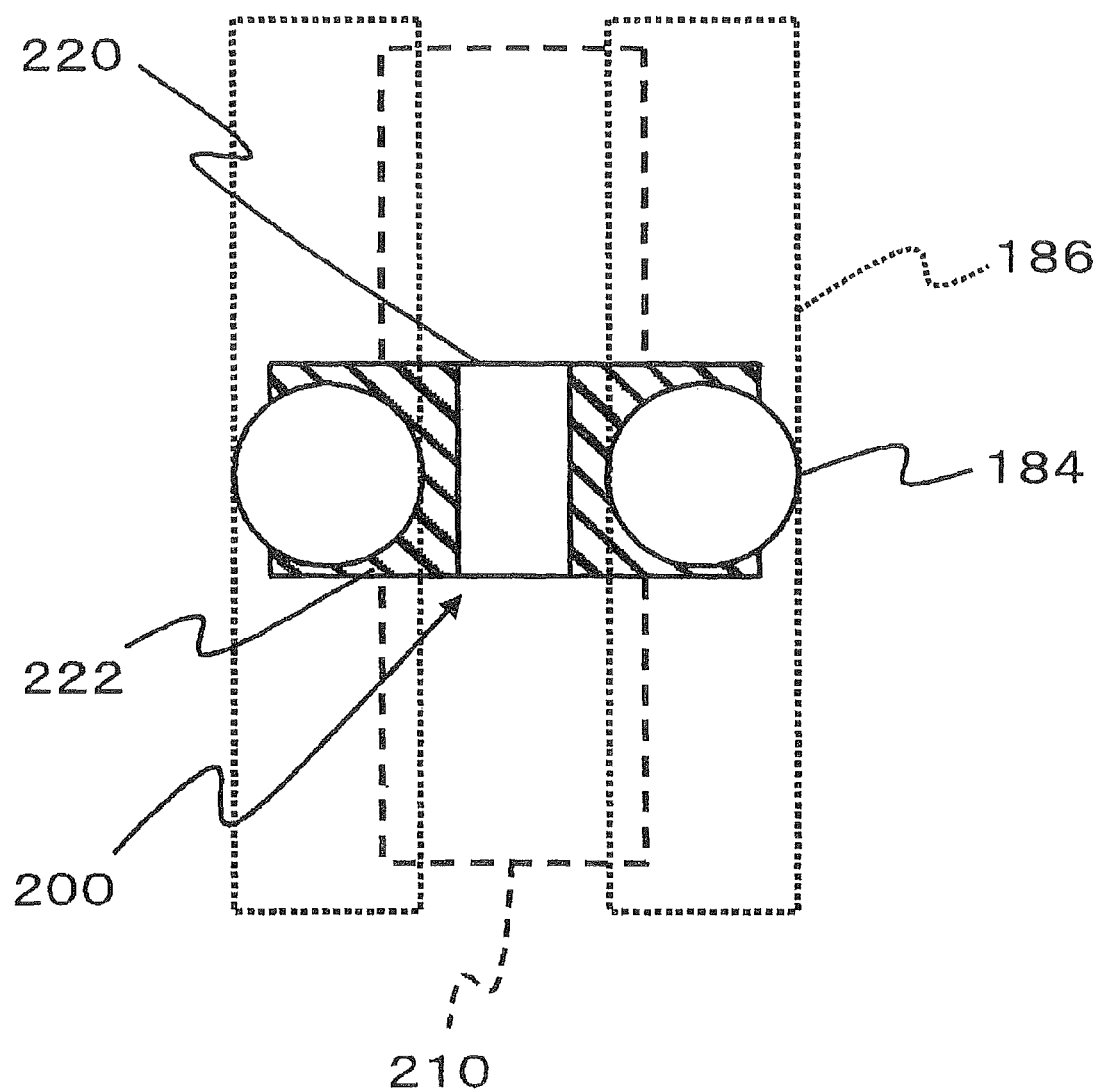
FIG. 3 is a plan view illustrating a configuration of an essential portion of the semiconductor device of the first embodiment.

FIG. 2 is a sectional view illustrating a semiconductor device of a first embodiment. FIG. 1 is an enlarged sectional view illustrating an essential portion of the configuration illustrated in FIG. 2, and more specifically, a configuration of a semiconductor element 200 owned by a semiconductor device illustrated in FIG. 2. FIG. 3 is a plan view illustrating a planar layout of the semiconductor element 200.

As illustrated in FIG. 2, the semiconductor device has a semiconductor substrate 100, a first interconnect layer 150, and a semiconductor element 200. The first interconnect layer 150 has an insulating layer 156 formed over the semiconductor substrate 100, and a first interconnect 154 filled in a surficial portion of the insulating layer 156.

As illustrated in FIG. 1, the semiconductor element 200 has a semiconductor layer 220, a gate insulating film 160, and a gate electrode 210. The semiconductor layer 220 is positioned over the first interconnect layer 150. The gate insulating film 160 is positioned over or below the semiconductor layer 220. The gate electrode 210 is positioned on the opposite side of the semiconductor layer 220 while placing the gate insulating film 160 in between. The semiconductor element 200 functions as a transistor.

In this embodiment, the gate insulating film 160 is positioned over the first interconnect layer 150. In other words, the gate insulating film 160 is positioned between the first interconnect layer 150 and the semiconductor layer 220. The gate electrode 210 is formed in the same layer with the first interconnect 154. The first interconnect 154 and the gate electrode 210 are typically composed of a copper interconnect, and are filled in the insulating layer 156 by damascene process. The width of the gate electrode 210 is typically 50 nm or wider and 500 nm or narrower.

The insulating layer 156 is typically composed of a low-k insulating layer having a dielectric constant smaller than that of silicon oxide (for example, a dielectric constant of equal to or smaller than 2.7). The low-k insulating layer may be configured typically by a carbon-containing film such as SiOC(H) film or SiLK (registered trademark); HSQ (hydrogen silsesquioxane) film; MHSQ (methylated hydrogen silsesquioxane) film; MSQ (methyl silsesquioxane) film; or porous film of any of these materials.

The semiconductor layer 220 typically has a thickness of 50 nm or larger and 300 nm or smaller. The semiconductor layer 220 typically has an oxide semiconductor layer such as InGaZnO (IGZO) or ZnO layer. The semiconductor layer 220 may have a single-layer structure composed of the above-described oxide semiconductor layer, or may have a stacked structure of the above-described oxide semiconductor layer with other layer(s). The latter may be exemplified by a stacked film expressed by $IGZO/Al_2O_3/IGZO/Al_2O_3$. Alternatively, the semiconductor layer 220 may be a polysilicon layer or amorphous silicon layer. The semiconductor layer 220 is provided with source-and-drain regions 222. For the case where the semiconductor layer 220 is an oxide semiconductor layer, the source-and-drain regions 222 may typically be formed by introducing oxygen vacancy, but may alternatively be formed by introducing an impurity. For the case where the semiconductor layer 220 is a polysilicon layer or amorphous silicon layer, the source-and-drain regions 222 may be formed by introducing an impurity. The width of the source-and-drain regions 222 is typically equal to or larger than 50 nm and equal to or smaller than 500 nm. The region of the semiconductor layer 220 which falls between the source-and-drain regions 222, serves as a channel region 224. The semiconductor conductivity type of the channel region 224 may be equal to those of the source-and-drain regions 222.

Over the first interconnect layer 150 and the semiconductor layer 220, an insulating layer 170 which configures a second interconnect layer is formed. The insulating layer 170 is typically composed of the above-described low-k insulating film. The gate insulating film 160 functions also as a diffusion blocking film, and is provided over the entire surface of the first interconnect layer 150. The semiconductor layer 220 is formed over the gate insulating film 160. The gate insulating film 160, or the diffusion blocking film, is typically composed of a SiCN film, having a thickness of equal to or, larger than 10 nm and equal to or smaller than 50 nm.

The insulating layer 170 has interconnects 186, 188 (second interconnects) filled therein. The interconnects 186 are connected through vias 184 which are formed in the insulating layer 170, to the source-and-drain regions 222. In other words, the source-and-drain regions 222 of the semiconductor element 200 are electrically drawn out through the interconnects 186 which are formed in the interconnect layer over the semiconductor element 200. The interconnect 188 is connected though a via 189 which is formed in the insulating layer 170, to the first interconnect 154. The vias 184 do not extend through the gate insulating film 160, meanwhile the via 189 extends through the gate insulating film 160. The vias 184 have a diameter larger than that of the via 189. Each via 184 illustrated in this drawing is partially not aligned with the semiconductor layer 220, but may alternatively be aligned therewith.

As illustrated in FIG. 2, a MOS transistor-type semiconductor element 110 is formed on the semiconductor substrate 100. The semiconductor element 110 functions typically as a transistor or capacitor element, and has a gate insulating film 112, a gate electrode 114, and impurity diffused regions 116 which serve as the source-and-drain regions. Element-forming region having the semiconductor element 110 formed therein is electrically isolated by a device isolation film 102. The semiconductor element 110 overlaps, at least in a portion thereof, with the semiconductor layer 220 in a plan view.

In the illustrated example in this drawing, a contact layer 120 and an interconnect layer 130 are formed between the first interconnect layer 150 and the semiconductor substrate 100. The interconnect layer 130 is positioned over the contact layer 120. The contact layer 120 has an insulating layer 124 and contacts 122, and the interconnect layer 130 has an insulating layer 134 and interconnects 132. The interconnects 132 are connected through the contact 122 to the semiconductor element 110. The interconnect 132 is connected through a via 152 which is formed in the insulating layer 156, to the first interconnect 154.

The insulating layer 124 is typically composed of a silicon oxide layer, and the insulating layer 134 is typically composed of the above-described, low-k insulating layer. Between the interconnect layer 130 and the first interconnect layer 150, there is formed a diffusion blocking film 140 such as a SiCN film. The semiconductor element 110 is electrically connected to the semiconductor element 200.

Figure 4A:
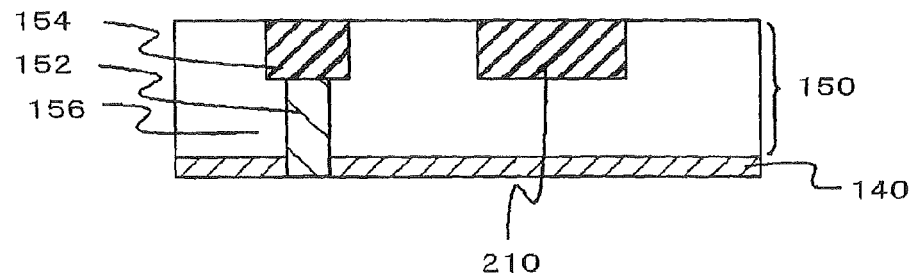
FIGS. 4A, 4B and 5 are sectional views illustrating a method of manufacturing the semiconductor device according to first embodiment.
Figure 4B:
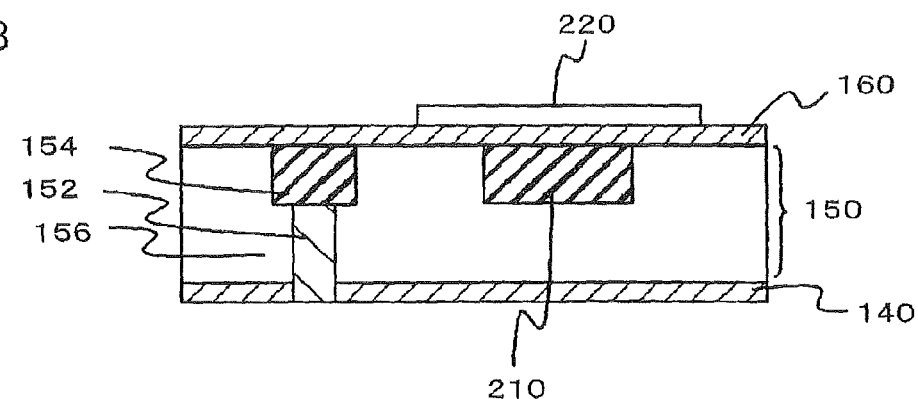
Figure 5:
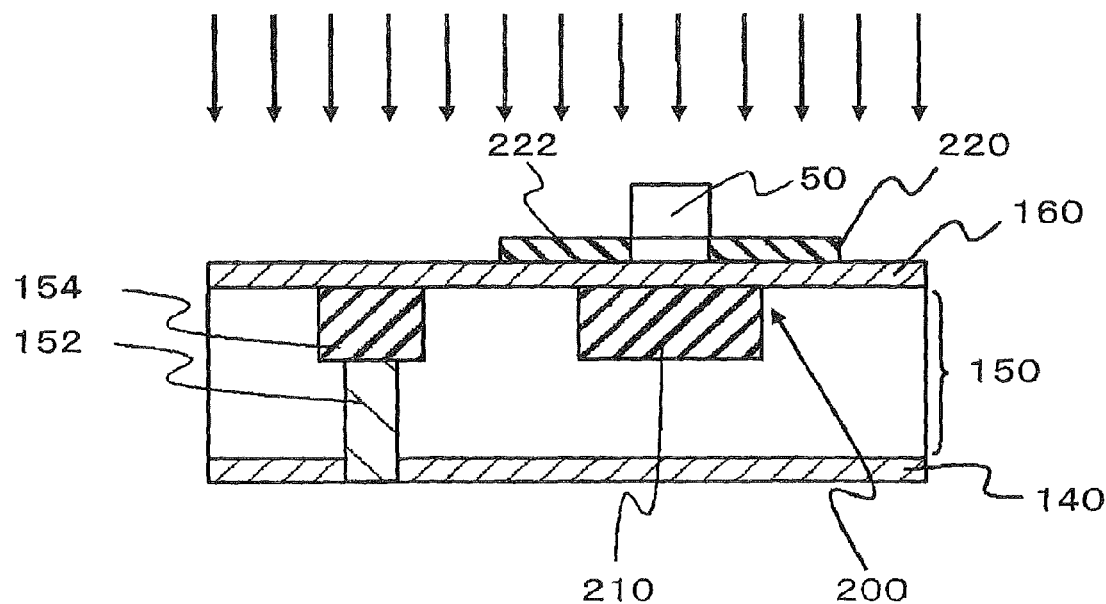

Next, a method of manufacturing a semiconductor device according to this embodiment will be explained referring to FIGS. 1, 2, 4A, 4B and 5. FIGS. 4A and 4B and FIG. 5 are drawings illustrating the portion corresponded to FIG. 1, in the semiconductor device illustrated in FIG. 2.

First, as illustrated in FIG. 2, the device isolation film 102 is formed in the semiconductor substrate 100, and then the gate insulating film 112, the gate electrode 114, and the impurity diffused regions 116 are formed in this order. Next, the contact layer 120, the interconnect layer 130, and the diffusion blocking film 140 are formed.

Next, as illustrated in FIG. 4A, the insulating layer 156 is formed on the diffusion blocking film 140. Next, the via 152, the first interconnect 154, and the gate electrode 210 are filled in the insulating layer 156 by single damascene process or dual damascene process. The first interconnect layer 150 is formed in this way.

Next, as illustrated in FIG. 4B, the gate insulating film 160 is formed on the first insulating layer 150 typically by plasma CVD. Since the gate insulating film 160 functions also as the diffusion blocking film as described in the above, so that the gate insulating film 160 is formed over the entire surface of the first insulating layer 150.

Next, the semiconductor layer 220 is formed over the entire surface of the gate insulating film 160, and the semiconductor layer 220 is then selectively removed by etching using a mask film. For the case where the semiconductor layer 220 contains an oxide semiconductor layer composed of ZnO, InGaZnO or the like, the semiconductor layer 220 may be formed typically by sputtering. In this case, the semiconductor substrate 100 is heated at a temperature of 400° C. or lower. For the case where the semiconductor layer 220 is a polysilicon layer or amorphous silicon layer, the semiconductor layer 220 may be formed typically by plasma CVD.

Next, as illustrated in FIG. 5, a mask pattern 50 is formed on the semiconductor layer 220, and the semiconductor layer 220 is treated using the mask pattern 50 as a mask. The source-and-drain regions 222 are formed in the semiconductor layer 220 in this way. The treatment which takes place herein may be exemplified by a method of treating the semiconductor layer 220 with a reductive plasma (hydrogen plasma, for example), and a method of treating the semiconductor layer 220 with a nitrogen-containing plasma (ammonia plasma, for example). The former treatment gives the source-and-drain regions 222 in a form of an oxygen vacancy region, meanwhile the latter treatment causes selective introduction of nitrogen into the semiconductor layer 220 to give the source-and-drain regions 222.

Now referring back to FIG. 1, the mask pattern 50 is then removed. Next, the insulating layer 170 is formed over the gate insulating film 160 and the semiconductor layer 220, and the vias 184, 189 and the interconnects 186, 188 are formed in the insulating layer 170. The vias 184, 189 herein are formed in different processes. More specifically, the vias 184 are formed so as not to extend through the gate insulating film 160, meanwhile the via 189 is formed so as to extend through the gate insulating film 160.

It is now preferable to form a barrier film (not illustrated) between the vias 184, 189 and the insulating layer 170, between the interconnects 186, 188 and the insulating layer 170, and between the vias 184 and the source-and-drain regions 222. The barrier film is a stacked film typically having a Ta film and a TaN film stacked in this order. If the semiconductor layer 220 is an oxide semiconductor layer, then a Ru film, MoN film, or W film may preliminarily be formed under the Ta film. In this case, the barrier film may be prevented from elevating in the resistivity, even if a portion thereof, brought into contact with the semiconductor layer 220, is oxidized.

Next, operations and effects of this embodiment will be explained. According to this embodiment, the semiconductor element 200 may be formed in the interconnect layer. The semiconductor element 200 functions as a transistor which is categorized as a switching element. As a consequence, functions of the semiconductor element formed on the semiconductor substrate may be modified to a large degree, without changing the layout of the semiconductor elements formed on the semiconductor substrate.

The gate insulating film 160 is also given with a function of a diffusion blocking film. It is, therefore, no more necessary to separately provide the gate insulating film 160 and the diffusion blocking film, and thereby the semiconductor device may be prevented from being complicated in the configuration, and from increasing in the cost of manufacturing.

Since the gate electrode 210 of the semiconductor element 200 is provided in the same layer with the first interconnect 154 in the first interconnect layer 150, so that the gate electrode 210 and the first interconnect 154 may be formed in the same process. Accordingly, the semiconductor device may be prevented from increasing in the cost of manufacturing.

For the case where the semiconductor layer 220 is configured by an oxide semiconductor layer, the temperature of heating of the semiconductor substrate 100 when the semiconductor layer 220 is formed may be set to 400° C. or lower, so that the interconnect layer positioned below the semiconductor layer 220 may be prevented from being thermally damaged. Accordingly, the low-k insulating film and the copper interconnect may be used for composing the interconnect layer.

In a plan view, the semiconductor elements 110, 200 overlap with each other at least in a portion thereof. The degree of integration of the semiconductor device may therefore be elevated.

Since, the vias 184, 189 are formed in separate processes, so that the gate insulating film 160 may be allowed to function as an etching stopper, when the vias 184 are formed, and thereby the vias 184 may be prevented from being excessively deepened.

Figure 6:
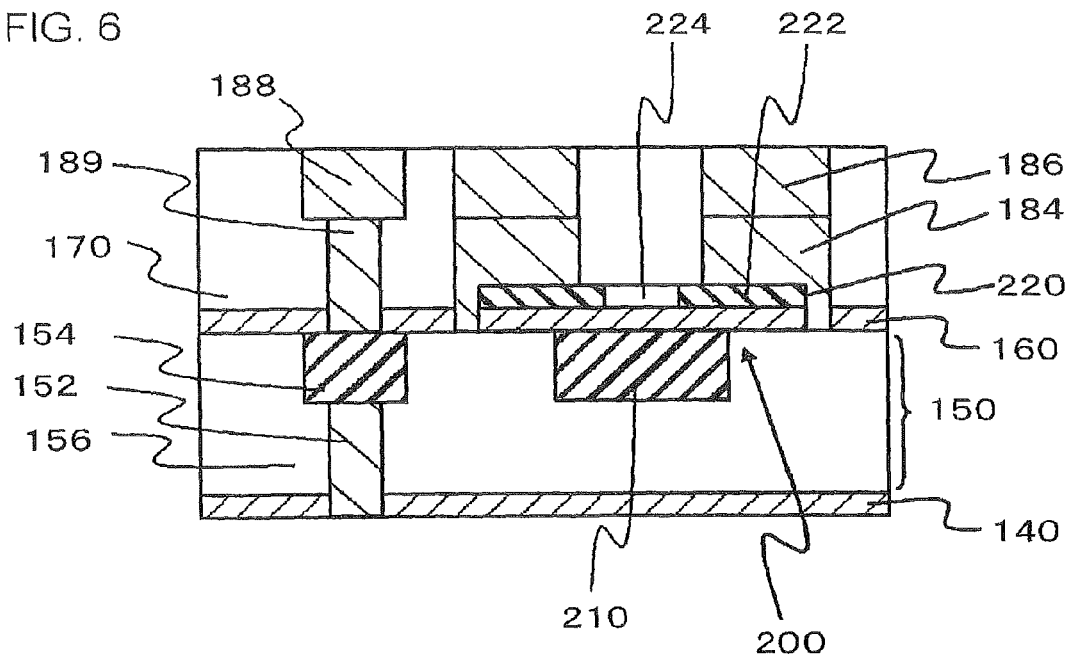
FIG. 6 is a sectional view illustrating a configuration of a semiconductor device according to a second embodiment.

FIG. 6 is a sectional view illustrating a semiconductor device according to a second embodiment, and corresponds to FIG. 1 in the first embodiment. The semiconductor device of this embodiment is similar to that of the first embodiment, except that the vias 184, 189 are formed in the same process. More specifically, for the case where portions of the vias 184 fall outside the semiconductor layer 220, such portions fallen outside extend through the gate insulating film 160.

Also in this embodiment, effects similar to those in the first embodiment may be obtained, except that the gate insulating film 160 is not allowed to function as an etching stopper when the vias 184 are formed.

Figure 7:
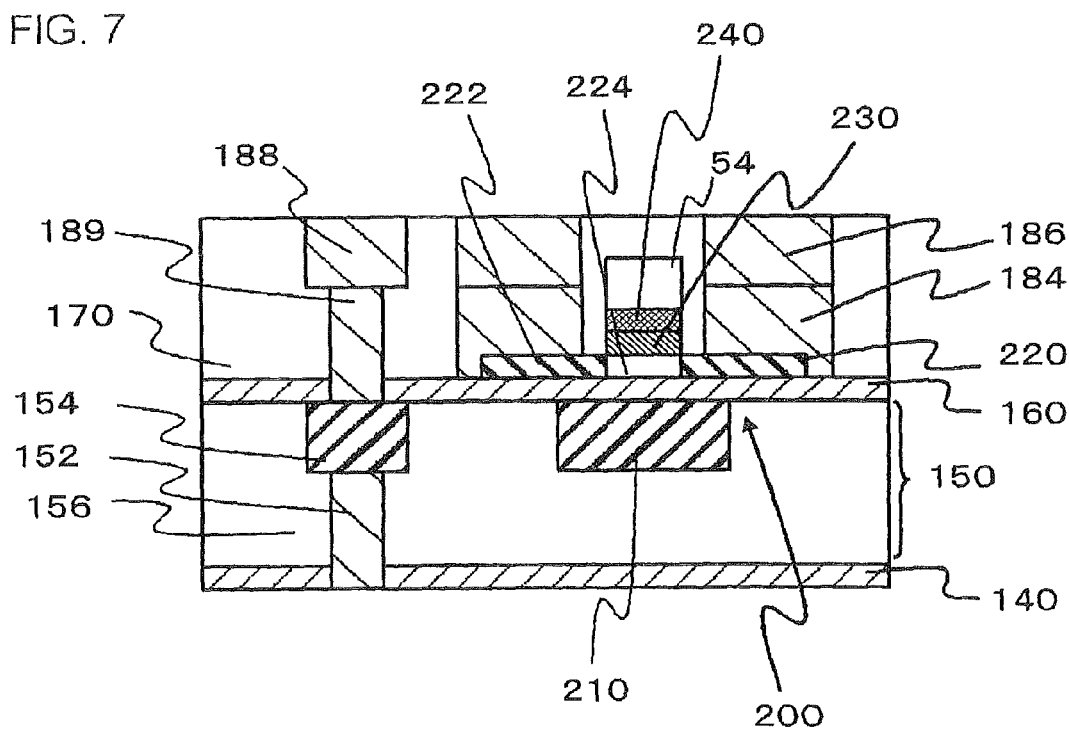
FIG. 7 is a sectional view illustrating a configuration of a semiconductor device according to a third embodiment.

FIG. 7 is a sectional view illustrating a semiconductor device according to a third embodiment, and corresponds to FIG. 1 in the first embodiment. The semiconductor device of this embodiment is configured similarly to the semiconductor device of the first embodiment, except that a trapping film 230 and a back-gate electrode 240 are formed over the semiconductor layer 220. The trapping film 230 and the back-gate electrode 240 overlap with the channel region 224 of the semiconductor layer 220 in a plan view. The semiconductor conductivity type of the channel region 224 may be equal to those of the source-and-drain regions 222. Note that, in the example illustrated in this drawing, a mask pattern 54, which was used when the back-gate electrode 240 was formed, remains unremoved on the back-gate electrode. The mask pattern 54 herein is typically a silicon oxide film, but may alternatively be a silicon nitride film or a silicon carbonitride film. A contact (not illustrated) connected to the back-gate electrode 240 extends through the mask pattern 54.

The trapping film 230 is typically a SiN film, and has a thickness of 5 nm or larger and 50 nm or smaller. The back-gate electrode 240 is typically a TiN film. The back-gate electrode 240 is electrically connected typically through an unillustrated contact to an interconnect (not illustrated) which is formed in the same layer with the interconnects 186, 188.

In this embodiment, the semiconductor element 200 functions not only as a transistor, but also as a memory element. In the latter case, the semiconductor element 110 may be a part of a selector circuit of the semiconductor element 200.

Figure 8:
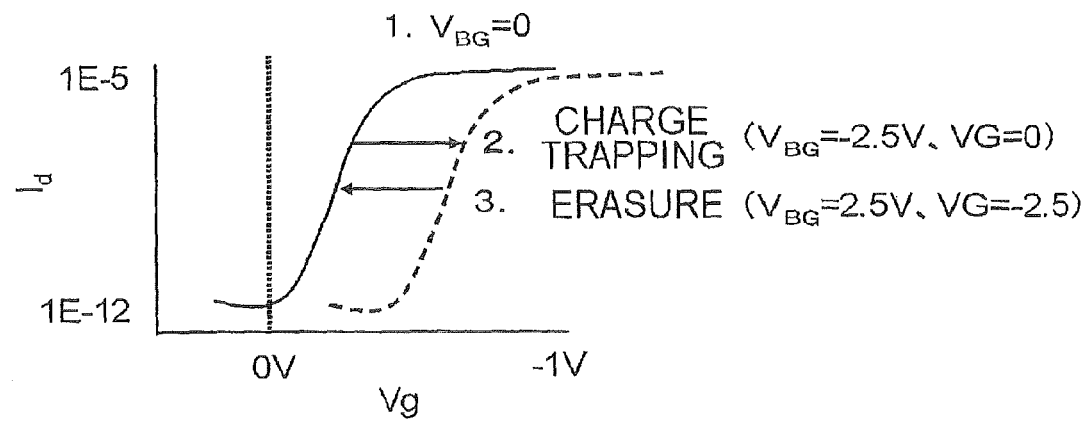
FIG. 8 is a drawing explaining a principle of function of the semiconductor element as a memory element.

FIG. 8 is a drawing explaining a principle of function of the semiconductor element 200 as a memory element. For the case where the semiconductor element 200 is allowed to function as a memory element, it may be acceptable enough to allow the trapping film 230 to be injected with (or to trap) electric charge (holes, for example), and to erase the trapped charge. This is because the threshold voltage ($V_{th}$) of the semiconductor element 200, which is made function as a transistor, varies depending on the presence or absence of electric charge trapped in the trapping film 230.

More specifically, voltage ($V_{BG}$) of the back-gate electrode 240 at the initial state (having no information written in the semiconductor element 200) is set to 0. In the process of write operation of information into the semiconductor element 200, a negative voltage (−2.5 V, for example) is applied to the back-gate electrode 240, so as to adjust the voltage ($V_G$) of the gate electrode 210 to 0. Holes are then injected to the trapping film 230, so as to shift the threshold voltage of the semiconductor element 200 to the negative side.

On the other hand, in the process of erasure of information from the semiconductor element 200, a positive voltage (+2.5 V, for example) is applied to the back-gate electrode 240, and a negative voltage (−2.5 V, for example) is applied to the gate electrode 210. The holes, having been injected into the trapping film 230 are then erased, and the threshold voltage of the semiconductor element 200 returns back to the initial value.

Also for the case where the semiconductor element 200 is used as a transistor, not as a memory element, the threshold voltage of the transistor may be modified by injecting electric charge into the trapping film 230.

Next, a method of manufacturing a semiconductor device according to this embodiment will be explained referring to FIGS. 9A, 9B and FIGS. 10A, 10B. The processes up to the formation of the gate insulating film 160 in the method of manufacturing a semiconductor device of this embodiment are same as those in the first embodiment, so that explanations for the processes will not be repeated.

Figure 9A:
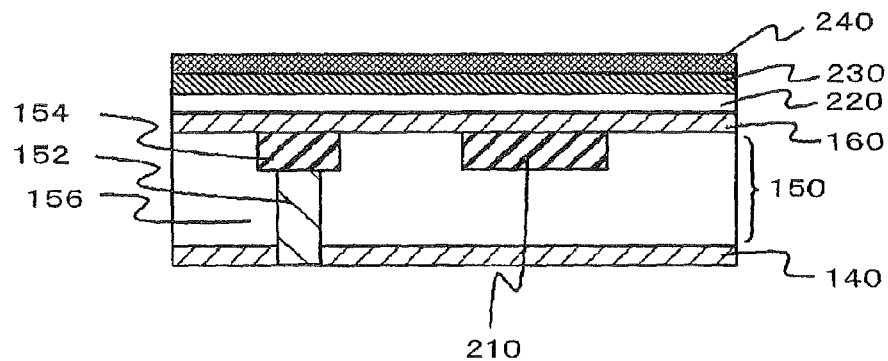
FIGS. 9A to 10B are sectional views illustrating a method of manufacturing the semiconductor device according to third embodiment.

As illustrated in FIG. 9A, after the gate insulating film 160 is formed, first the semiconductor layer 220 is formed over the gate insulating film 160. Next, over the semiconductor layer 220, the trapping film 230 and the back-gate electrode 240 are formed. The trapping film 230 is formed typically by plasma CVD, and the back-gate electrode 240 is formed typically by sputtering.

Figure 9B:
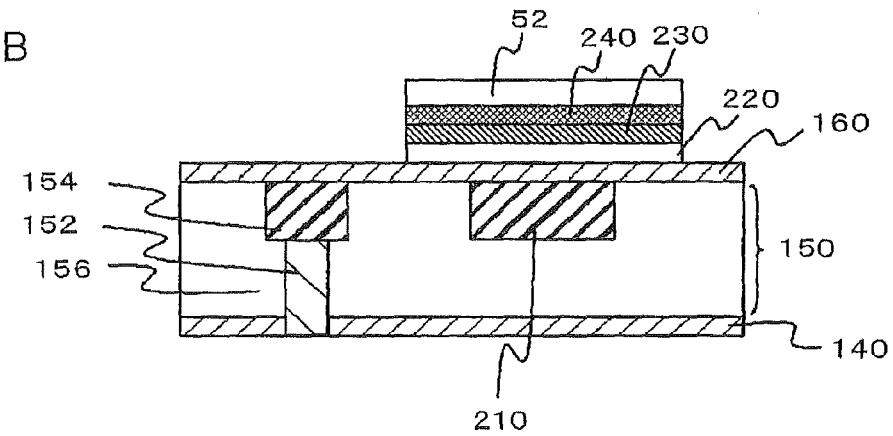

Next, as illustrated in FIG. 9B, a mask pattern 52 is formed on the back-gate electrode 240. The back-gate electrode 240, the trapping film 230, and the semiconductor layer 220 are then etched by dry etching, using the mask pattern 52 as a mask. By this process, the semiconductor layer 220 is patterned to give the semiconductor element 200. Geometries of the back-gate electrode 240 and the trapping film 230 are nearly equal to that of the semiconductor layer 220.

Figure 10A:
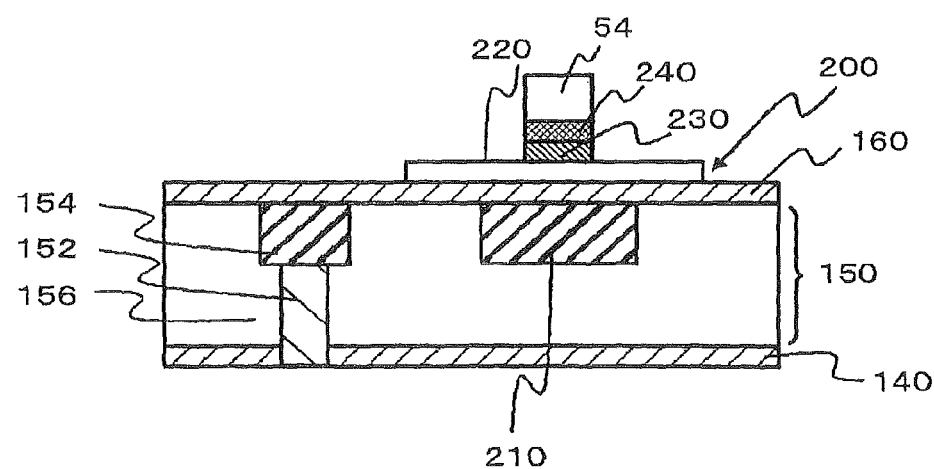

Next, as illustrated in FIG. 10A, the mask pattern 52 is removed. The mask pattern 54 is then formed on the back-gate electrode 240. The mask pattern 54 is formed typically by forming a silicon oxide film, and then selectively removing the silicon oxide film. Alternatively, the mask pattern 54 may be formed by selectively removing any other film such as a silicon nitride film or silicon carbonitride film. Next, the trapping film 230 and the back-gate electrode 240 are etched by dry etching, using the mask pattern 54 as a mask. By this process, the trapping film 230 and the back-gate electrode 240 may be patterned to give the semiconductor element 200.

Figure 10B:
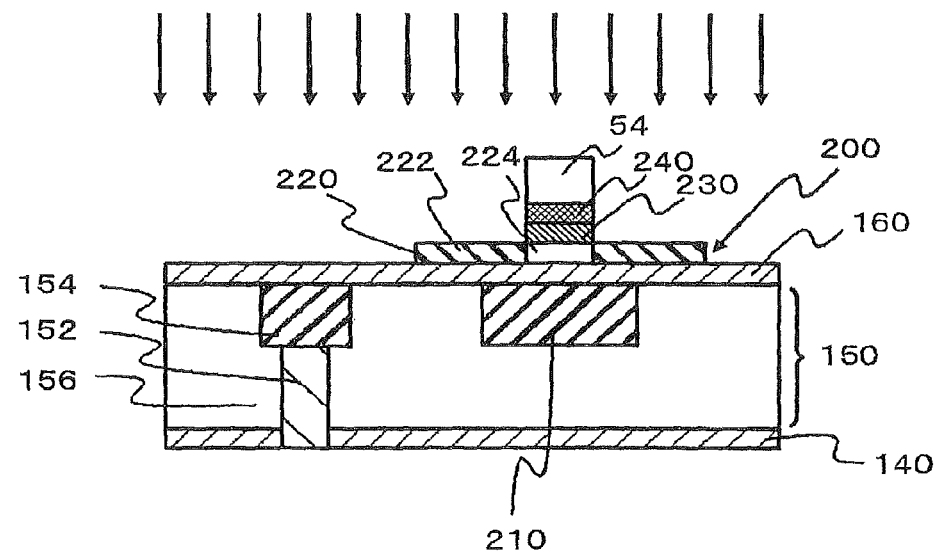

Thereafter, as illustrated in FIG. 10B, the semiconductor layer 220 is treated using the back-gate electrode 240 as a mask. The source-and-drain regions 222 are consequently formed in the semiconductor layer 220. The treatment took place herein is the same as described in the first embodiment.

Next, the insulating layer 170 illustrated in FIG. 7 is formed. The processes thereafter are same with those described in the first embodiment, and will not repetitively be explained.

Also in this embodiment, effects similar to those in the first embodiment may be obtained. The semiconductor element 200 may be used again as a memory element.

Figure 11:
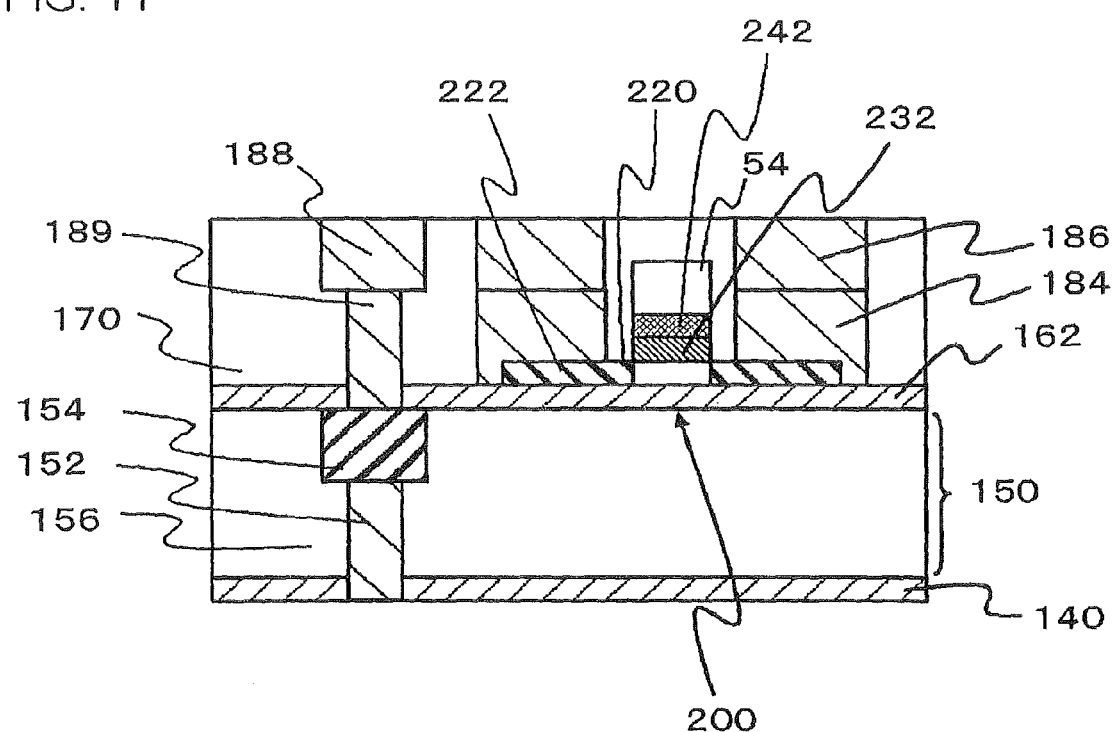
FIG. 11 is a sectional view illustrating a configuration of a semiconductor device according to a fourth embodiment.

FIG. 11 is a sectional view illustrating a configuration of a semiconductor device according to a fourth embodiment, and corresponds to FIG. 7 in the third embodiment. The semiconductor device is configured similarly to the semiconductor device of the third embodiment, except that the gate electrode 210 is not provided, and that a gate insulating film 232 and a gate electrode 242 are positioned over the semiconductor layer 220.

The gate insulating film 232 is configured similarly to the trapping film 230 in the third embodiment, and the gate electrode 242 is configured similarly to the back-gate electrode 240 in the third embodiment.

On the first interconnect layer 150, a diffusion blocking film 162 is provided. The configuration of the diffusion blocking film 162 is same as that of the gate insulating film 160 in the third embodiment.

A method of manufacturing a semiconductor device of this embodiment is same as the method of manufacturing a semiconductor device of the third embodiment, except that the gate electrode 210 is not formed when the interconnect 154 is formed.

Also by this embodiment, the semiconductor element 200 may be formed in the interconnect layer. As a consequence, functions of the semiconductor element formed on the semiconductor substrate may be modified to a large degree, without changing the layout of the semiconductor elements formed on the semiconductor substrate.

For the case where the semiconductor layer 220 is configured by an oxide semiconductor layer, the temperature of heating of the semiconductor substrate 100 when the semiconductor layer 220 is formed may be set to 400° C. or lower, so that the interconnect layer positioned below the semiconductor layer 220 may be prevented from being thermally damaged.

In a plan view, the semiconductor elements 110, 200 overlap with each other at least in a portion thereof. The degree of integration of the semiconductor device may therefore be elevated.

Since, the vias 184, 189 are formed in separate processes, so that the gate insulating film 160 may be allowed to function as an etching stopper, when the vias 184 are formed, and thereby the vias 184 may be prevented from being excessively deepened.

The embodiments of the present invention have been described referring to the attached drawings merely as examples of the present invention, without being precluded from adopting any configurations other than those described in the above. For example, the first interconnect 154 and the gate electrode 210 may preferably be composed of copper interconnects, and may preferably be filled in the insulating layer 156 by the damascene process, whereas other interconnects positioned in other interconnect layers, for example at least either the interconnect 132, or the interconnects 186, 188, may be composed of any other metal material (Al or Al alloy, for example). In this case, also the vias 152, 184, 189 are formed using a metal other than copper. For example, the interconnects 132, 154, the via 152, and gate electrode 210 may be composed of copper or copper alloy, and the interconnects 186, 188 and vias 184, 189 which are positioned in the upper layers of the semiconductor element 200 may be composed of Al or Al alloy.

It is apparent that the present invention is not limited to the above embodiments, but may be modified and changed without departing from the scope and spirit of the invention.

What is claimed is:

1. A method of manufacturing a semiconductor device, comprising:
preparing a semiconductor substrate;
forming a first insulating film over said semiconductor substrate;
after forming the first insulating film, forming first grooves in the first insulating film;
forming a gate electrode and a first interconnect in the first grooves, respectively;
forming a gate insulating film over the gate electrode;
forming a semiconductor layer over the gate insulating film;
forming a second insulating layer over the semiconductor layer and the first insulating film;
forming a via in the second insulating layer; and
forming a second interconnect such that the second interconnect is connected to the semiconductor layer through the via,
wherein the gate electrode, the first interconnect and the second interconnect are formed by Cu or Cu alloy, respectively.

2. The method of manufacturing a semiconductor device as claimed in claim 1,
wherein the first interconnects and the gate electrode are filled in the first insulating film by single damascene process or dual damascene process.

3. The method of manufacturing a semiconductor device as claimed in claim 1,
wherein the gate insulating film is formed by plasma CVD.

4. The method of manufacturing a semiconductor device as claimed in claim 1,
wherein the semiconductor layer is an oxide semiconductor layer; and
wherein the semiconductor layer is formed by sputtering and heated at a temperature of 400° C. or low.

5. The method of manufacturing a semiconductor device as claimed in claim 1,
wherein the semiconductor layer is a polysilicon layer or amorphous silicon; and
wherein the semiconductor layer is formed by plasma CVD.

6. The method of manufacturing a semiconductor device as claimed in claim 1,
wherein a mask pattern as a mask is formed over the semiconductor layer to form a source-and-drain regions.

7. The method of manufacturing a semiconductor device as claimed in claim 1,
wherein the via is formed so as not to extend through the gate insulating film.

8. The method of manufacturing a semiconductor device as claimed in claim 1,
wherein the via falling outside the semiconductor is forming so as to extend through the gate insulating film.

9. A method of manufacturing a semiconductor device, comprising:
preparing a semiconductor substrate;
forming a first insulating film over the semiconductor substrate;
after forming the first insulating film, forming first grooves in the first insulating film;
forming a gate electrode and a first interconnect in the first grooves, respectively;
forming a gate insulating film over the gate electrode;
forming a semiconductor layer over the gate insulating film;
forming a second insulating layer over the semiconductor layer and the first insulating film;
forming a via in the second insulating layer; and forming a second interconnect over the second insulating film such that the second interconnect is connected to the semiconductor layer through the via, wherein the gate electrode and the first interconnect are formed by Cu or Cu alloy, respectively, and wherein the second interconnect is formed by Al or Al alloy.

10. The method of manufacturing a semiconductor device as claimed in claim 9, wherein the gate electrode and the first interconnect are filled in the first insulating film by single damascene process or dual damascene process.

11. The method of manufacturing a semiconductor device as claimed in claim 9, wherein the gate insulating film is formed by plasma CVD.

12. The method of manufacturing a semiconductor device as claimed in claim 9, wherein the semiconductor layer is an oxide semiconductor layer; and wherein the semiconductor layer is formed by sputtering and heated at a temperature of 400° C. or low.

13. The method of manufacturing a semiconductor device as claimed in claim 9, wherein the semiconductor layer is a polysilicon layer or amorphous silicon; and wherein the semiconductor layer is formed by plasma CVD.

14. A method of manufacturing a semiconductor device, comprising:

forming a first insulating film over a semiconductor substrate;

after forming the first insulating film, forming first grooves in the first insulating film;

forming a gate electrode and a first interconnect in the first grooves, respectively;

forming a gate insulating film over the gate electrode;

forming a semiconductor layer over the gate insulating film;

forming a second insulating layer over the semiconductor layer and the first insulating film;

forming a via in the second insulating layer; and forming a second interconnect such that the second interconnect is connected to the semiconductor layer through the via, wherein the gate electrode and the first interconnect are formed by a first type alloy, respectively, and wherein the second interconnect is formed by a second type alloy different than the first type alloy.

15. The method of manufacturing a semiconductor device as claimed in claim 14, wherein the first interconnects is filled in the first insulating film by a single damascene process or dual damascene process.

16. The method of manufacturing a semiconductor device as claimed in claim 14, wherein the gate electrode is filled in the first insulating film by single damascene process or dual damascene process.

17. The method of manufacturing a semiconductor device as claimed in claim 14, wherein the semiconductor layer is an oxide semiconductor layer; and wherein the semiconductor layer is formed by sputtering and heated at a temperature of 400° C. or low.

18. The method of manufacturing a semiconductor device as claimed in claim 14, wherein the semiconductor layer is a polysilicon layer or amorphous silicon; and wherein the semiconductor layer is formed by plasma CVD.

19. The method of manufacturing a semiconductor device as claimed in claim 14, wherein a mask pattern as a mask is formed over the semiconductor layer to form a source-and-drain regions.

20. The method of manufacturing a semiconductor device as claimed in claim 14, wherein the via is formed so as not to extend through the gate insulating film, and wherein the via falling outside the semiconductor is formed so as to extend through the gate insulating film.

* * * * *